BULK EFFECT MICROWAVE OSCILLATOR PROVIDING A HIGH IMPEDANCE TO SECOND HARMONIC OSCILLATIONS

Filed March 5, 1968

INVENTOR.
RICHARD M. WHITEHORN
BY Wm f Nolan
ATTORNEY

United States Patent Office 3,471,806

Patented Oct. 7, 1969

3,471,806

BULK EFFECT MICROWAVE OSCILLATOR PROVIDING A HIGH IMPEDANCE TO SECOND HARMONIC OSCILLATIONS

Richard M. Whitehorn, San Carlos, Calif., assignor to Varian Associates, Palo Alto, Calif., a corporation of California Filed Mar. 5, 1968, Ser. No. 710,563

Int. Cl. H03b *5/36*

U.S. Cl. 331—107 6 Claims

ABSTRACT OF THE DISCLOSURE

A solid state microwave oscillator is disclosed. The oscillator circuit includes a resonated section of waveguide forming a relatively high Q cavity resonator circuit having a loaded Q of approximately 300. A bulk effect device capable of exhibiting negative resistance to its output terminals, such as a limited space charge accumulation diode, is connected across the mouth of a second section of waveguide where it communicates through an end wall of the resonator. The resonator is tuned to the fundamental frequency of the oscillator. The second section of waveguide has a lower characteristic impedance than the first waveguide and is dimensioned to be cutoff for the fundamental frequency of the oscillator such that fundamental wave energy is not substantially coupled into the second waveguide. A slidable tuning plunger is disposed in the end of the second waveguide for tuning the length of the second line to present an admittance zero to the bulk effect device at the second harmonic of the operating frequency of the oscillator, such that very little of the oscillatory energy is dissipated at the second harmonic. However, the very high conductance of the bulk effect device is matched via the coupling network to the high conductance of the relatively high Q cavity resonances for efficient oscillator operation on the fundamental resonant frequency of the cavity resonator.

DESCRIPTION OF THE PRIOR ART

Heretofore, various microwave circuits have been developed for matching the extremely high conductance of a bulk effect solid state device to a resonant circuit of an oscillator. One such prior art oscillator circuit employed a half wavelength resonant section of stripline open circuited at its ends to form an oscillator circuit. The oscillator circuit was coupled by means of an inductive coupling iris to a second stripline resonator similar to the first circuit in that it comprised a half wavelength section of stripline open circuited at its ends. The first open circuited section of stripline formed a primary circuit of a transformer and had the bulk effect device, such as a Gunn diode, connected across the primary stripline resonator at a point substantially midway along its length. In this manner, the diode was positioned at approximately a voltage null for matching the extremely high conductance of the bulk effect device to the stripline resonator. Such an oscillator is described and claimed in copending U.S. application 641,536 filed May 26, 1967, now Patent No. 3,416,099 and assigned to the same assignee as the present invention.

While the aforementioned prior art oscillator circuits provided means for matching the extremely high conductance of the bulk effect devices to the resonant microwave circuits in which they were employed, insufficient attention was directed to the second harmonic of the oscillator frequency. It was found that these prior art circuits also provided a voltage null in approximately the same position for the second harmonic of the oscillator. Therefore, the second harmonic of the oscillator was impedance matched to the diode and a substantial amount of second harmonic power was being dissipated, thereby reducing the operating efficiency of the oscillator.

Therefore, a need exists for a microwave oscillator circuit useful with solid state bulk effect devices having very high conductances. This oscillator circuit should present a high conductance to the device at the fundamental frequency of the oscillator while presenting a relatively low conductance to the bulk effect device at the second harmonic of the output frequency of the oscillator.

SUMMARY OF THE PRESENT INVENTION

The principal object of the present invention is the provision of an improved microwave oscillator circuit for use with negative resistance bulk effect devices.

One feature of the present invention is the provision, in a solid state microwave oscillator circuit, of a first section of waveguide resonated at the fundamental operating frequency of the oscillator and including a shallow section of narrower waveguide cutoff at the fundamental frequency and communicating through the wall of the resonator with the bulk effect device disposed across the mouth of the shallow waveguide, such waveguide being tuned to present an admittance zero at the second harmonic frequency to the bulk effect device, whereby the efficiency of the oscillator is improved by minimizing power loss in the second harmonic mode of the oscillator.

Another feature of the present invention is the same as the preceding feature wherein the mouth of the shallow waveguide is positioned at a point in the fundamental mode resonator which corresponds to substantially a voltage null for the fundamental resonant mode, whereby the high conductance of the bulk effect device is matched to a high Q high conductance point of the fundamental mode resonator.

Another feature of the present invention is the same as any one or more of the preceding features wherein the cutoff section of shallow waveguide includes a slidable tuning plunger which is positioned to make the cutoff section of waveguide approximately an odd number of quarter electrical wavelengths long from the sliding tuner to the solid state device at the second harmonic frequency.

Another feature of the present invention is the same as any one or more of the preceding features wherein the bulk effect device is dimensioned for operation on a limited space charge accumulation mode.

Other features and advantages of the present invention become apparent upon a perusal of the following specification taken in connection with the accompanying drawings wherein:

DESCRIPTION OF THE PREFERRED EMBODIMENTS

Figure 1:
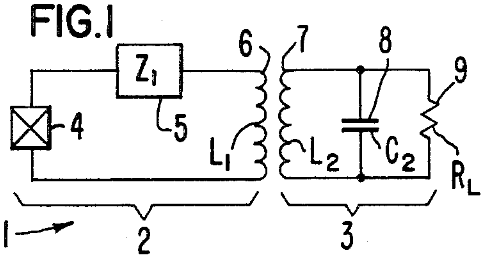
FIG. 1 is a lumped equivalent circuit for the microwave circuit of the present invention.

Referring now to FIG. 1, there is shown a lumped element equivalent circuit 1 for the microwave oscillator of the present invention. Briefly, the circuit includes a primary circuit 2 and a secondary circuit 3. The primary circuit 2 includes a series connection of a bulk effect diode 4, an impedance 5, and a small inductor 6, $L_1$. $L_1$ is on the order of 0.1 nanohenry. The primary circuit 2 is inductively coupled to the secondary circuit 3. The secondary circuit 3 includes an inductor $L_2$, indicated at 7, which is resonated with a capacitor $C_2$, indicated at 8, at the fundamental frequency of the oscillator. A load 9, represented by load resistor $R_L$, is connected across the resonant circuit. The resonant circuit 3 should have a loaded Q on the order of approximately 300. The bulk effect diode 4 will have a low field resistance on the order of 10 ohms or less.

The primary circuit 2 including $L_1$, $Z_1$ and the diode 4 should present a high impedance to the resistive component of the diode 4 at the fundamental operating frequency and its second harmonic. The primary circuit 2 should be loosely and variably coupled to the secondary circuit 3 containing the load. The inductances required become very low for high power, high frequency operation. For example, at 8 gigahertz, a bulk effect device 4 with a low field resistance, of 2 ohms or so, requires inductances $L_1$ and $L_2$ of less than 0.1 nanohenry.

Figures 2, 3, 5, 6:
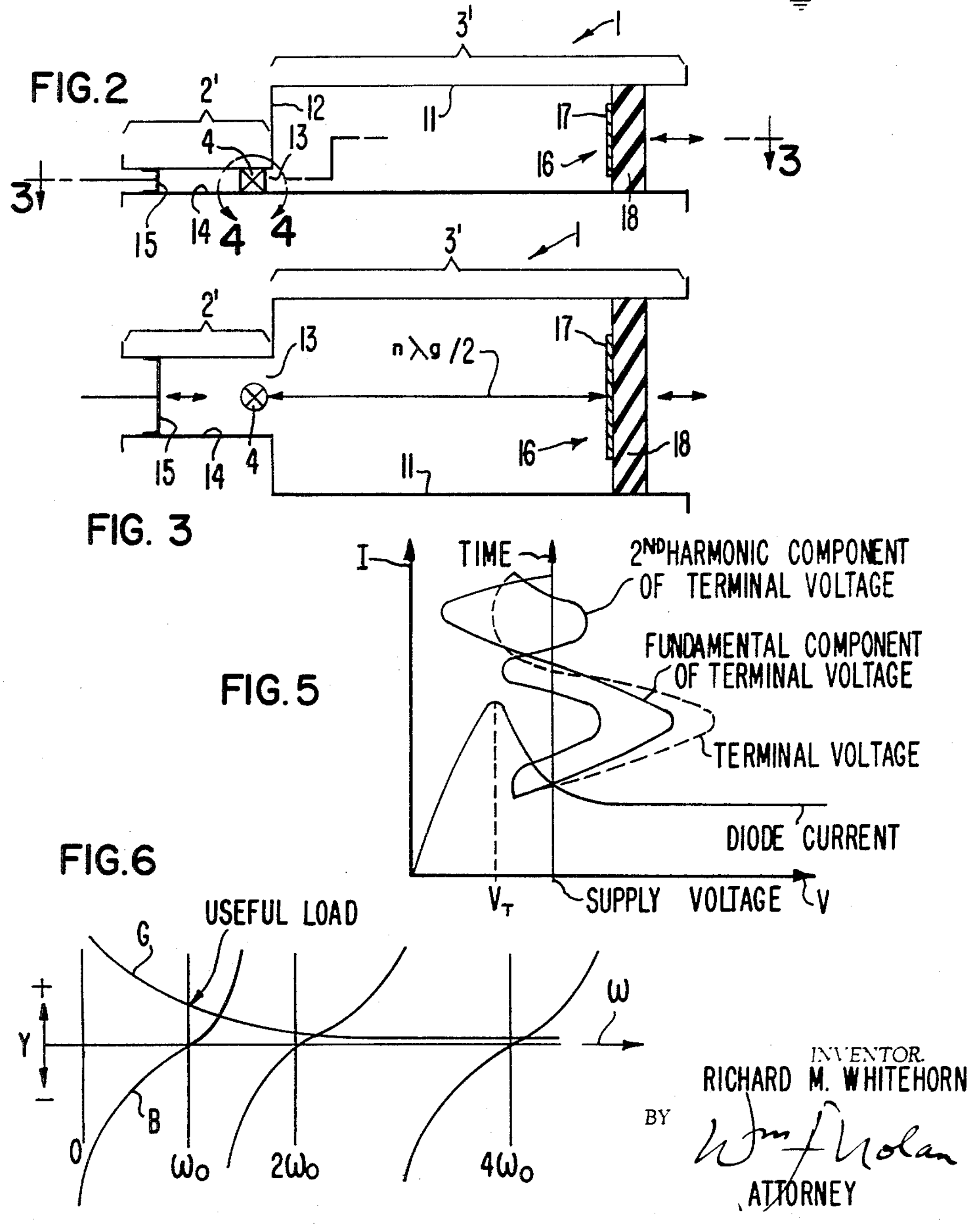
FIG. 2 is a schematic longitudinal sectional view of a microwave oscillator incorporating features of the present invention.
FIG. 3 is a sectional view of the structure of FIG. 2 taken along line 3—3 in the direction of the arrows.
FIG. 5 is a plot of D.C. current and time versus voltage depicting the D.C. and dynamic negative resistive characteristic of the bulk effect devices utilized in the oscillators of the present invention.
FIG. 6 is a plot of driving point admittance versus frequency for the circuit of FIGS. 2 and 3.

Referring now to FIGS. 2 and 3, there is shown the microwave circuit corresponding to the lumped equivalent circuit of FIG. 1. More particularly, the secondary circuit 3, indicated at 3′, comprises a length of hollow rectangular waveguide 11 substantially shorted at one end 12 by means of an end conductive wall. The open end or mouth 13 of a section of shallow low impedance hollow rectangular waveguide 14 communicates through the end wall 12 of the higher impedance waveguide 11. The shallow waveguide 14 has its broad dimension dimensioned for fundamental mode transmission at the second harmonic of the oscillator frequency. Thus, waveguide 14 is cutoff for the fundamental operating frequency of the oscillator.

The bulk effect diode device 4 is connected across the mouth or open end 13 of the shallow waveguide 14. A slidable shorting tuning plunger 15 closes off the other end of the shallow waveguide 14. The position of the plunged 15 is chosed to present a zero susceptance to the diode 4 at the second harmonic of the oscillator. This generally requires that the distance along the waveguide 14 from the shorting plunger 15 to the diode 4 be an odd number of quarter electrical wavelengths at the second harmonic frequency.

Thus, the primary circuit 2′ includes the shallow waveguide 14, tuner 15, and diode 4. The impedance $Z_1$ is formed by the odd number of quarter electrical wavelengths, at the second harmonic, between the tuning plunger 15 and the diode 4. The small primary inductance 6 is formed by the open end 13 of the waveguide 14.

The output end of the secondary circuit, resonator 3′, is formed by a tuned wave reflective discontinuity 16. The reflective discontinuity comprises a conductive disc 17 centrally mounted on the face of an insulative plug 18 as of Teflon. The plug 18 is axially movable of the waveguide 11 for tuning of the resonator 3′. The resonator circuit 3′ is tuned for an integral number of half electrical wavelengths from the wall 12 to the reflector 16 at the output frequency of the oscillator. However, $n$ is preferably 1 in order to operate on a fundamental mode of the cavity resonator 3′. Output energy is coupled through the dielectric block 18 around the outer periphery of the conductive disc 17 to a load, not shown.

By mounting the diode 4 in the center of the shallow low impedance waveguide 14 and substantially at the mouth 13, the small inductances $L_1$ and $L_2$ are obtained, as required, with low attendant losses. Coupling from the diode 4 to the cavity resonator 3′ is controlled by the positioning of the reflector 16 and by the intensity of the standing wave pattern in the output guide between the reflector 16 and the load, not shown. By making the shallow guide 14 narrow enough, i.e. cutoff, the fundamental frequency of oscillation will not propagate therein such that independent control is obtained over the second harmonic circuit impedance.

Figure 4:
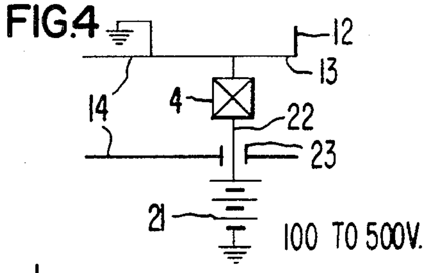
FIG. 4 is an enlarged schematic view of a portion of the structure of FIG. 2 delineated by lines 4—4.

Referring now to FIG. 4 there is shown the bias circuit for applying the bias to the bulk effect diode 4. One terminal of the diode 4 is connected to the top broad wall of waveguide 14 and the other terminal of the diode 4 is connected to a source of D.C. potential 21 via lead 22. A relatively large lossy bypass capacitor 23, as of Mylar, permits the D.C. voltage lead 22 to be fed through the lower wall of the waveguide 14. The R.F. loss associated with the Mylar capacitor 23 prevents setting up of resonant modes of oscillation associated with the bias circuit.

The narrow waveguide width for waveguide 14 is chosen so that it does not have a real propagation constant at the oscillator operating frequency but does at the second and higher harmonics of the operating frequency. At the operating frequency, the driving point admittance presented to the diode 4 consists of the inductive susceptance presented by the small guide 14 in parallel with an admittance representing the flow of wall current in the main resonator 3′ in response to an electric field at the narrow waveguide mouth 13. So long as the length of the narrow waveguide 14 is not short compared to its width, the operating frequency driving point admittance is largely unaffected by its length since there is no real propagation in the narrow guide 14 at the operating frequency.

There will be a susceptance zero in the admittance presented to the diode 4 at a frequency slightly lower than the frequency at which the main cavity would be resonant if the mouth of the narrow guide were filled with metal. At the same frequency, there will be a finite conductive component determined by the loaded Q of the main cavity 3′. If the narrow guide 14 is also of quite low height compared to the main cavity 3′, large transformation ratios are obtained so that high conductance high Q resonances are presented to the diode terminals. High power limited space charge accumulation (LSA) diodes 4 have conductances that are high compared to typical waveguide structures. By the means described, such devices can be tuned and coupled efficiently to a normal waveguide 3′.

The admittance presented to the diode terminals at harmonics of the operating frequency can be controlled by structures introduced into the narrow waveguide 14 since, in general, the admittance presented by the main cavity 3′ will be quite small except at resonance. Most simply, if the narrow guide 14 is fitted with a shorting plunger 15 spaced approximately an odd number of narrow guide quarter wavelengths from the diode 4 at the second harmonic of the operating frequency, an admittance zero will be presented to the diode at the second harmonic $2\omega_0$ so that the diode 4 can operate with a strongly assymetrical waveform. No power will be dissipated at the second harmonic except via incidental conductive components of the admittance introduced via the main cavity 3′. The dynamics of operation are illustrated in FIG. 5 in which a plot of diode terminal voltage V vs. time is superimposed on a plot of the voltage V and current I characteristic of a diode 4.

When the circuit is oscillating, the amplitude of oscillation will be just large enough so that the losses presented by the useful load and those introduced by excursions into the positive high conductance region of the diode characteristic just balance the gain due to the negative conductance of the diode. The amplitude of the fundamental component of the oscillation, which delivers useful power, can be increased considerably by the introduction of even harmonics to flatten the negative swings of the diode voltage to keep it near the peak current point. By this means a large increase in D.C. to A.C. conversion efficiency can be obtained.

An ideal driving point admittance for the conductive portion of the diode admittance would be as shown in FIG. 6 in which $\omega_0$ is the operating frequency. In this case, where all odd harmonics are low loss zeros the diode terminal waveform will approximate a half wave rectified sinusoid plus a D.C. component.

The bulk effect devices 4 are typically operated with bias voltages in the range of $3V_T$ to $5V_T$ and are generally operated in a pulsed mode of operation with a pulse repetition rate of approximately 1000 hertz and a pulse duration of approximately 200 nanoseconds. In a typical example, the oscillator efficiency is 6% producing output pulses having a peak power of 50 watts at X band. The diode devices are preferably bulk effect negative resistance devices having a thickness varying from 100 to 200 microns and preferably operated in the limited space charge accumulation (LSA) mode.

Since many changes could be made in the above construction and many apparently widely different embodiments of this invention could be made without departing from the scope thereof, if it is intended that all matter contained in the above description or shown in the accompanying drawings shall be interpreted as illustrative and not in a limiting sense.

What is claimed is:

1. In a high frequency oscillator circuit, means forming a first section of hollow transmission line tuned for resonance at the fundamental output frequency of the oscillator, means forming an output terminal in said section of transmission line for coupling high frequency energy to a load, means forming a solid state device capable of presenting a negative resistance across a pair of its output terminals with a certain D.C. bias potential applied across said device, the improvement comprising, means forming a second section of transmission line communicating with said first section of resonated transmission line through a wall thereof, said second section of transmission line having cross sectional dimensions which are sufficiently small to be cutoff for wave energy at the fundamental output frequency of the oscillator, and said second section of transmission line having an open mouth at its entrance to said resonant section of first transmission line, said solid state device being connected across the open mouth of said second transmission line, and said second transmission line being tuned to present an admittance zero at the second harmonic frequency of the oscillator to said solid state device, whereby power dissipation in the second harmonic of the oscillator is reduced to provide increased efficiency at the fundamental frequency of the oscillator.

2. The apparatus of claim 1 wherein the mouth of said second section of transmission line is positioned at a point in said first section of resonant transmission line which corresponds to substantially a voltage null for the fundamental oscillator frequency, whereby the high conductance of said device is matched to the high conductance high Q resonances of said resonant section of first transmission line.

3. The apparatus of claim 1 wherein said solid state device is a bulk effect device.

4. The apparatus of claim 3 wherein said solid state device is dimensioned for operation on a limited space charge accumulation mode.

5. The apparatus of claim 1 including means forming a slidable tuner plunger movable along said second section of transmission line for tuning same, and wherein said slidable tuner is positioned to make said second section of transmission line approximately an odd number of quarter electrical wavelengths long at the second harmonic frequency from said sliding tuner to said solid state device.

6. The apparatus of claim 1 wherein said second section of transmission line has a characteristic impedance substantially less than the characteristic impedance of said first section of hollow transmission line.

References Cited

J. E. Carroll, "Resonant-Circuit Operating of Gunn Diodes: A Self-Pumped Parametric Oscillator," Electronics Letters, June 1966, vol. 2, No. 6, pp. 215, 216.

ROY LAKE, Primary Examiner

SIEGFRIED H. GRIMM, Assistant Examiner

U.S. Cl. X.R.

331—96